Figure 2A:
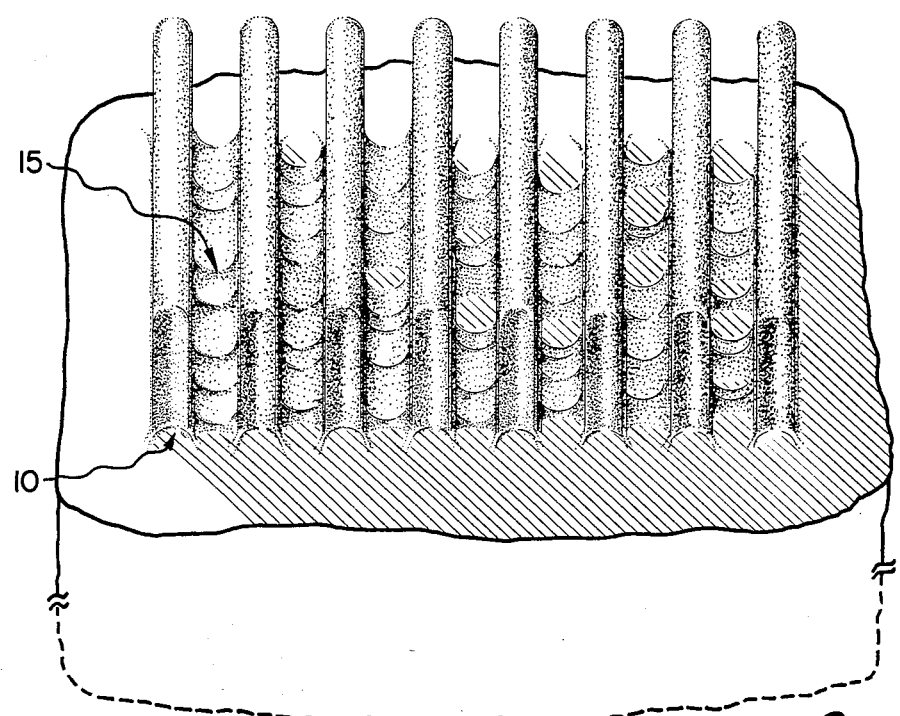

| United States Patent [19] | [11] Patent Number: 4,578,344 |
| Griffing et al. | [45] Date of Patent: Mar. 25, 1986 |

[54] PHOTOLITHOGRAPHIC METHOD USING A TWO-LAYER PHOTORESIST AND PHOTOBLEACHABLE FILM

[75] Inventors: Bruce F. Griffing, Schenectady; Paul R. West, Clifton Park, both of N.Y.

[73] Assignee: General Electric Company, Schenectady, N.Y.

[21] Appl. No.: 684,395

[22] Filed: Dec. 20, 1984

[51] Int. Cl.[4] .................................................. G03C 5/00
[52] U.S. Cl. ................................... 430/312; 430/156; 430/394; 430/396; 430/502; 430/512; 430/950
[58] Field of Search ............... 430/156, 312, 950, 961, 430/394, 396, 502, 503, 512

[56] References Cited

U.S. PATENT DOCUMENTS

| 3,925,077 | 12/1975 | Lewis et al. | 430/2 |
| 4,225,661 | 9/1980 | Muzyczko | 430/156 |
| 4,411,978 | 10/1983 | Laridon et al. | 430/321 |
| 4,413,051 | 11/1983 | Thomas | 430/312 |
| 4,464,458 | 8/1984 | Chow et al. | 430/312 |

OTHER PUBLICATIONS

West et al., Proceedings of the Society of Photo-Optical Instrumentation Engineers, No. 394 (1983), pp. 33–37.
Griffing et al., Polymer and Engineering and Science, vol. 23, (17), 1983, pp. 947–952.

*Primary Examiner*—Jack P. Brammer
*Attorney, Agent, or Firm*—William A. Teoli; James C. Davis, Jr.; James Magee, Jr.

[57] ABSTRACT

A photobleachable layer has been found to improve the resolution limits of two-layer photoresists for making integrated circuits.

4 Claims, 5 Drawing Figures

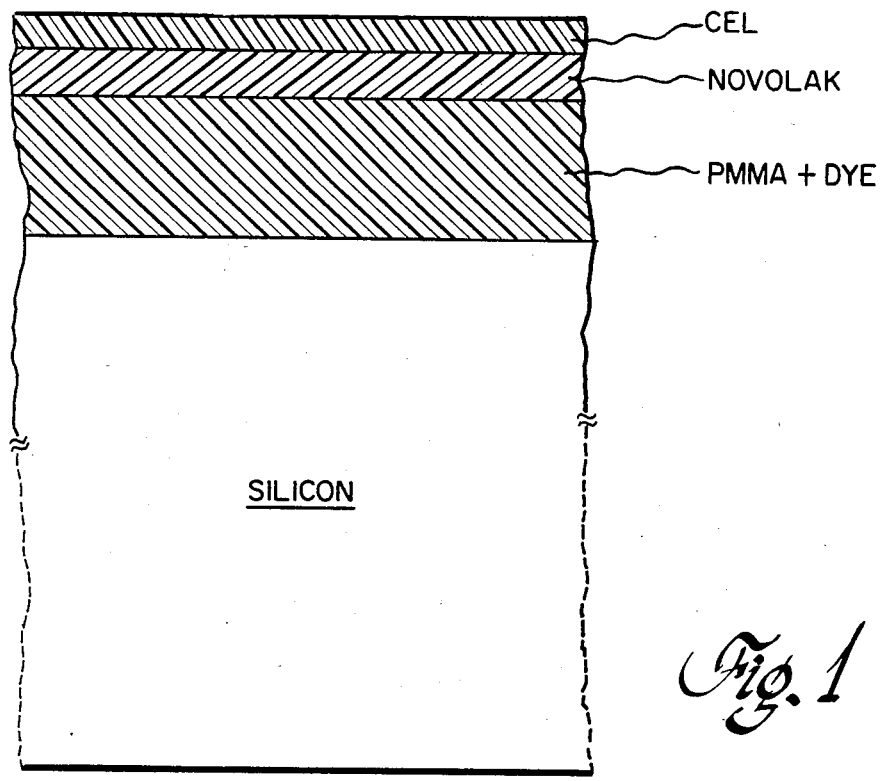
Fig. 1
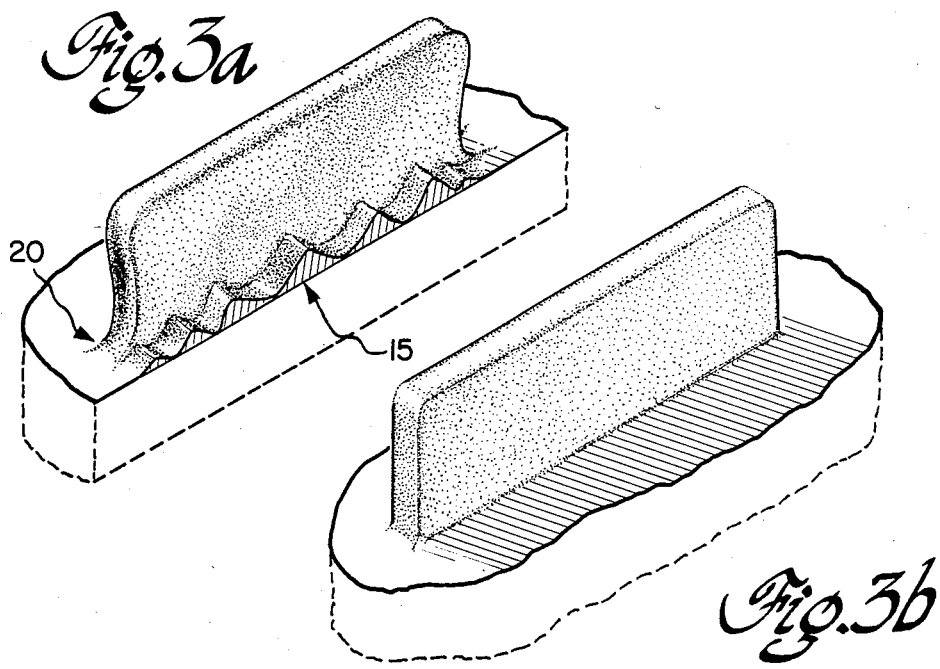
Fig. 3a
Fig. 3b

PHOTOLITHOGRAPHIC METHOD USING A TWO-LAYER PHOTORESIST AND PHOTOBLEACHABLE FILM

CROSS REFERENCE TO RELATED APPLICATIONS

Reference is made to our copending application Ser. No. 536,923, filed Sept. 28, 1983, A Method of Enhancing the Contrast of Images and Materials Therefor, which is a continuation-in-part application of Ser. No. 438,194, filed Nov. 11, 1982, now abandoned, assigned to the same assignee as the present invention and incorporated herein by reference. Reference is also made to our copending application Ser. No. 619,526, filed June 11, 1984 now U.S. Pat. No. 4,535,053, for Spin Castable Resist Compositions and Use, which is also assigned to the same assignee as the present invention and incorporated herein by reference.

BACKGROUND OF THE INVENTION

As taught in our copending application Ser. No. 619,526, significant advantages are achieved in photolithography when two-layer resists are used to produce a pattern on a suitable substrate in the fabrication of electronic devices or integrated circuitry on semiconductor chips. Depth of focus limitations are minimized by confining primary imaging to a positive photoresist which is uniformly applied as a thin film on top of a thick planarizing polymer layer, such as a polymethylmethacrylate. A suitable dye which absorbs in the active region of the thinly applied upper positive resist layer can be incorporated into the thicker PMMA planarizing base layer. The dye can absorb any stray light which might tend to reflect from the supporting substrate back to the thin upper positive resist layer interfering with a sharp resolution in the resulting portable conformable mask (PCM) obtained from the upper positive photoresist. Although improved results have been achieved with the two-layer photoresist procedure as shown by Chen et al., U.S. Pat. No. 4,362,809, variations in the profiles and thickness of the upper resist pattern can reduce its effectiveness as a mask during deep UV exposure of the lower resist layer. Rounded contours and lack of uniformity in the thickness of the final vertical resist profiles often can result.

Figure 2B:
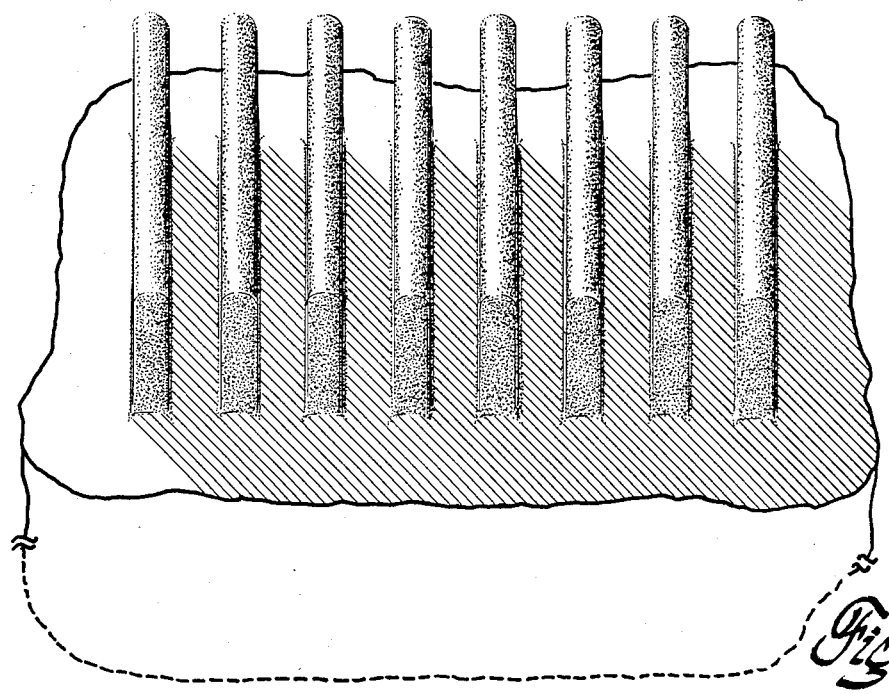

The present invention is based on the discovery that improvement in wall profiles and problems associated with reflections and diffraction effects, such as remnants of resist residue, as shown by FIGS. 2a and 3a, can be substantially eliminated as, shown by FIGS. 2b and 3b, by combining contrast enhanced photolithography with the aforementioned two-layer photoresist technology.

STATEMENT OF THE INVENTION

In a photolithographic method using a two-layer photoresist resulting in an incomplete resolution of the lower photoresist layer due to variations in the profile and thickness of the upper photoresist pattern, the improvement which comprises, applying a photobleachable film onto the surface of the upper photoresist layer prior to exposing the two-layer photoresist to patterned UV light, thereby reducing the variations and thickness of the resulting portable conformable mask obtained from the development of the exposed upper photoresist layer and improving the resolution of the resulting patterned photoresist relief obtained from the subsequent exposure and development of the lower photoresist layer.

In order to more fully understand the advantages of the invention, reference is made to the drawings. In FIG. 1, there is shown a sectional view of a silicon substrate coated with a layer of PMMA, novolac and CEL. FIGS. 2a, 2b, 3a and 3b show results obtained with and without the use of CEL, such as differences in grading patterns and forked line ends.

There is shown more particularly in FIG. 1, a photoresist composite which can be used in the practice of the present invention which can be used to pattern various substrates during the fabrication of electronic devices and integrated circuits. In FIG. I, PMMA means polymethylmethacrylate having an absorbant dye which is used to make a thick planarizing antireflecting photosensitive polymer layer, positive resist layer means a photoresist, such as a polynovolak, which can be used to produce an upper portable conformable mask (PCM). There is also shown at FIG. 1, a contrast enhancement layer (CEL) which contains a photobleachable compound which will be defined more fully hereinafter.

There is shown more particularly in FIG. 2a, line 15 and FIG. 3a line 15, incompletely resolved grading patterns, forked line ends in FIG. 2a, line 10 and FIG. 3a, line 20, while FIG. 3b shows a section free of such defects.

Among the polymethylmethacrylates which can be utilized in the practice of the present invention to make the initial antireflective resist layer at the surface of the interface, as shown in FIG. 1, are for example, Elvacite®2041 and 2010 of the DuPont de Nemours Company, Wilmington, Del.; KTI standard PMMA resist, etc. As taught in our copending application Ser. No. 619,526, the aforementioned PMMA resist can be utilized in combination with an absorbant dye such as the 1,3-propane diol diester of methyl(p-diethylamino-α-cyano)cinnamic acid or coumarin. The PMMA resist layer can be applied onto a substrate such as a silicon substrate or glass substrate in the form of a spin castable mixture, comprising 100 parts of an inert organic solvent, for example, toluene, chlorobenzene, methylisobutylketone, etc., where there can be utilized 100 parts of the organic solvent, 1–15 parts of the PMMA and 0.01–1.0 parts of the absorbant dye. The dye can be absorbing at about 436 nm and nonabsorbing at about 220–250 nm.

Among the positive photoresist compositions which can be used in the production of the PCM (portable conformable mask), there are included novolak resins modified with naphthoquinonediazides as shown in the chemical behavior of positive working systems by Jeffrey C. Streeter, Eastman Kodak Company, Proceedings of the Microelectronic Seminar Interface '76, pp. 116–121. A typical reaction for preparing these positive photoresists is to react the hydroxyl groups on a phenol-formaldehyde resin with naphthoquinone-diazide sulfonyl chloride. The most common solvents used in the novolak positive resists are 2-ethoxyethylacetate and 2-methoxyethylacetate. In some cases, xylene and butylacetate can be incorporated into the solvent system to give various drying and coating characteristics.

Spin castable mixtures which can be utilized to form the CEL shown in FIG. 1, are more particularly described in our copending application Ser. No. 536,923.

There can be utilized, for example a mixture comprising by weight, (A) 100 parts of an organic solvent,
(B) 1-30 parts, preferably 5-15 parts of an inert organic polymer binder, and
(C) 1-30 parts, preferably 5-15 parts of an aryl nitrone.

Aryl nitrones which can be used in the practice of the method of the present invention to make the photobleachable layer are included by the formula

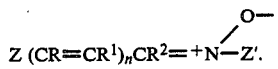
(1)

In formula 1, Z is a monovalent group selected from

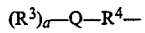

or $R^5$—, and $Z'$ is a monovalent group selected from —$R^6(X)_b$, R, $R^1$, $R^2$ and $R^3$ are monovalent radicals selected from the class of hydrogen, $C_{(1-8)}$ alkyl, $C_{(1-8)}$ substituted alkyl, $C_{(6-13)}$ aryl hydrocarbon and $C_{(6-13)}$ substituted aryl hydrocarbons. Q is a monovalent, divalent or trivalent atom selected from the group F, C, Br, I, O, S, N, where a can have values of 0, 1 or 2. $R^4$ is a $C_{(6-13)}$ aryl hydrocarbon or a $C_{(6-13)}$ substituted aryl hydrocarbon. $R^5$ is selected from the group of substituted or unsubstituted $C_{(6-20)}$ aromatic heterocyclic compounds incorporating one or more atoms from the group O, N or S. $R^6$ is selected from the group of $C_{(6-20)}$ aromatic hydrocarbons and X is selected from the group of halo, cyano, alkyl carbonyl, $C_{(1-8)}$ alkyl, $C_{(1-8)}$ substituted alkyl, $C_{(6-13)}$ aryl hydrocarbon, $C_{(6-13)}$ substituted aryl hydrocarbons, or alkoxy carbonyl in any combination for values of b which can be 0, 1, 2 or 3, n can have a value of 0, 1, 2, 3 or 4. The above compounds can be prepared using procedures such as those described in "Methoden der Organischen Chemie (Houben-Weyl), Vol. 10, part 4 (1968), pages 315–416, or those described in Chemical Reviews 1 (64), Nitrones, by Jan Hamer and Anthony Macaluso, pages 476–483.

Various aryl ring systems with a variety of substituents may be constructed to suit the particular needs of the optical system employed in the photoimaging process. The aryl nitrones exhibit extinction coefficients of 2 to $5 \times 10^4$ liter mole$^{-1}$cm$^{-1}$ and bleach with quantum yields in the range of 0.1 to 0.5.

For direct-step-on-the wafer systems capable of imaging at 405 nm, the following nitrones have been found to be particularly useful,

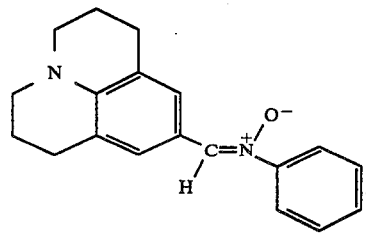
(2)

where Ar is a $C_{(6-13)}$ monovalent aromatic organic radical or substituted $C_{(6-13)}$ monovalent aromatic organic radical and n is equal to 0 or 1. Included among this subclass of p-aminoaryl nitrones, are heterocyclic compounds such as

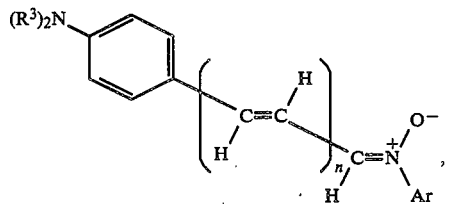
(3)

Suitable binders for use in providing a spin castable mixture for the formation of a photobleachable layer incorporating the aryl nitrones of formula (1) are: vinyl acetate polymers (homopolymers and copolymers) and their partially saponified products (e.g., polyvinylacetate), copolymers of styrene or its derivatives, polymers and copolymers of acrylate or methacrylate esters, acetal resins, acrylonitrile/butadiene copolymers, ethyl cellulose and other hydrocarbon-soluble cellulose ethers, cellulose propionate and other hydrocarbon-soluble cellulose esters, poly(chloroprene), poly(ethylene oxide), polyvinylpyrrolidone).

Suitable solvents for use in providing a spin castable mixture to form the photobleachable layer which incorporates the aryl nitrone of formula (1) are: aromatic hydrocarbons (e.g. toluene xylenes, ethyl benzene, chlorobenzene) with or without aliphatic hydrocarbons (e.g. cyclohexane), halogenated aliphatic compounds (e.g. trichloroethylene, methyl chloroform, alcohols (e.g. propanol, butanol).

Diaryl nitrones of formula 2, where $R^3$ is $CH_3CH_2$— and n=0 have been found to be particularly useful. For example, α-(4-diethylaminophenyl)-N-phenylnitrone, was found to absorb strongly at 405 nm, and it bleaches to near transparency with high efficiency at the same wavelength by undergoing unimolecular cyclization to an oxaziridine. It is very soluble in solvents of moderately low polarity (e.g., toluene, ethylbenzene) and forms good films at high loading densities with a variety of polymers such as polystyrene, poly(hydroxyethylmethacrylate), poly-α-methylstyrene, poly(methylmethacrylate), polyvinylpyrrolidone, vinylpyridine/styrene copolymers and allyl alcohol/styrene copolymers. In addition, α-(4-diethylaminophenyl)-N-phenylnitrone has an extinction coefficient to weight ratio of 130 liters/gram-cm at 405 nm. It can be formed into a contrast enhancing layer by forming a 8% solution in toluene with styrene/allyl alcohol copolymer as a binder.

In the practice of the method of the present invention, a composite photoresist structure, as shown by FIG. 1 is made by initially spin casting in a conventional manner, a polymethylmethacrylate resin onto a suitable substrate such as a silicon substrate, for example, a silicon wafer, utilizing a solution of the polymethylmethacrylate resin in an organic solvent such as toluene, which also can contain an absorbant dye as previously indicated. There can be used a mixture of 100 parts of the organic solvent, 1-15 parts of the PMMA and 0.01 to 1 part of absorbant dye.

After the PMMA layer has been spun onto the surface of the substrate, it can be baked to a temperature of 140°-200° C. to produce a polymethylmethacrylate resist layer having a thickness of from 1-3 microns. A positive photoresist then can be applied to a thickness of from about 0.1-1.0 microns. The positive photoresist, which can be a novolak resin modified with naphthoquinonediazide utilized in a solvent, such as 2-ethoxyethylacetate or 2-methoxyethylacetate, or in some cases xylene and butylacetate, also can be spun onto the PMMA surface to a thickness of about 0.5 microns. The positive novolak resist then can be baked at a temperature in the range of 70°–90° C. for a period of 1–30 minutes. The contrast enhancement layer can be spun onto the surface of the positive photoresist to a thickness of about 0.2 to 1.0 microns.

Exposure of the photolithographic composite of FIG. 1 can be accomplished with mercury arc lamp having an intensity of 100 mw/cm$^2$ and a wavelength of from 360–40 nm for a period of from 0.3 to 1 second. The contrast enhancement layer and positive photoresist layers can be exposed simultaneously using a printer operating at the appropriate wavelength. The removal of the contrast enhancement layer (CEL) is best accomplished by spraying the CEL with an appropriate solvent such as trichloroethylene. After removal of the CEL, the positive resist is then developed with a conventional developing solution, such as an aqueous alkali hydroxide. The NaOH should have a molar concentration in the range of from 0.2 to 0.5 for optimum results. If desired, the developed PCM then can be oxygen plasma cleaned in accordance with the procedure of Petrillo et al, Submicrometer Contact Hole Delineation with a Two-Layer Deep-UV Portable Conformable Masking System, J. Vac. Sci. Technol. B 1(4), Oct.-Dec. 1983.

The positive resist PMMA composite can be exposed to UV irradiation having a wavelength of from 190 to 250 nm. The resulting exposed PMMA composite can be developed utilizing a standard acetone/isopropanol solution to produce a patterned PMMA photoresist layer on a an appropriate substrate, such as a silicon wafer, useful for making a semiconductor device.

In order that those skilled in the art will be better able to practice the invention, the following example is given by way of illustration and not by way of limitation. All parts are by weight.

EXAMPLE 1

A chlorobenzene solution of 8% PMMA (Elvacite ®2041) and 0.4% of the 1,3-propane diol diester of methyl(p-diethylamino-α-cyano)cinnamic acid was spun-cast onto two silicon wafers. Two coats of the resin solution were applied with a 30 minute bake at 180° C. after each coat. The resulting "yellow PMMA" film on each wafer was coated at 5000 rpm with Shipley 1450B photoresist and baked for 7 minutes at 85° C. One of the wafers was then coated with a contrast enhancing layer (CEL) using a solution containing 8% by weight of α-(4-diethylaminophenyl)-N-phenyl nitrone and 8% by weight of an allyl alcohol styrene copolymer in ethyl benzene. The wafers were then exposed using an Optimetrix 8010 stepper with a matrix of exposures. The wafer with the CEL was spray stripped for 15 seconds with trichloroethylene and then spray developed for 15 seconds with Shipley 351 developer diluted one part with three parts water. The wafer without the CEL was directly spray developed with a higher contrast developer, i.e. Shipley 351 diluted one part with 5 parts water for 25 seconds. Both wafers were then flood exposed for 75 seconds using a Fusion Systems deep UV source equipped with a mercury lamp. The wafers were subsequently spray developed using diglyme and rinsed with isopropanol. From the original exposure matrix, die with the best quality 0.8μ line and space patterns were selected. This corresponded to 2150 milliseconds for the wafer with CEL and 660 milliseconds for the wafer without CEL. The wafer without CEL showed resolved 0.8μ line/space patterns with small defects. The same die, however, had incompletely resolved 0.65μ grating patterns, as shown by 15 in FIGS. 2a and 3a and pronounced defects resulting in forked line ends, as by 10 of FIG. 2a and 20 of FIG. 3a. By contrast, the die on the CEL wafer with good 0.8μ grating also had line/space patterns of 0.65μ which were cleanly resolved and free of defects.

Although the above example is directed to only a few of the very many variables which can be used in the practice of the method of the present invention, it should be understood that the method of the present invention is directed to much broader variety of PMMA resists, positive resists and CEL spin castable mixtures.

What we claim as new and desire to secure by Letters Patent of the United States is:

1. In a photolithographic method of forming a patterned photoresist relief from a two-layer photoresist which comprises,
   (1) depositing a first resist on a substrate to produce a bottom resist layer having a substantially planar top surface, and depositing a second resist as a top resist layer producing a multilayer substrate coating having the bottom resist layer sandwiched between the substrate and the top resist layer and
   (2) exposing the top resist layer to light in a range in which the second resist is insensitive, said light having been passed through a mask to expose only selected portions of the top resist layer and
   (3) thereafter developing the top layer to produce a portable conformable mask and the layers of the substrate coating other than the top resist layer processed to replicate the pattern of this portable conformable mask to such layers, whereby an incomplete resolution of the lower photoresist layer is obtained due to variations in the profile and thickness of the upper photoresist pattern, the improvement which comprises, applying a photobleachable film comprising an arylnitrone and an inert organic polymer binder onto the surface of the upper photoresist layer prior to exposing the two-layer photoresist to patterned UV light, whereby reducing the variations and thickness of the resulting portably conformable mask obtained from the development of the exposed upper photoresist layer and thereby improving the resolution of the resulting patterned photoresist relief obtained from the subsequent exposure and development of lower photoresist layer.

2. A method in accordance with claim 1, where the two-layer photoresist comprises a polymethylmethacrylate layer coated with a polynovolak resin.

3. A method in accordance with claim 1, where the photobleachable film comprises α-(4-diethylaminophenyl)-N-phenylnitrone and a styrene/allylcohol copolymer.

4. A method in accordance with claim 2, where the polymethylmethacrylate layer contains an effective amount of 1,3-propanediol diester of methyl(p-diethylamino-α-cyano)cinnamic acid.

* * * * *